United States Patent
Aingaran

(10) Patent No.: US 6,335,639 B1
(45) Date of Patent: Jan. 1, 2002

(54) NON-MONOTONIC DYNAMIC EXCLUSIVE-OR/NOR GATE CIRCUIT

(75) Inventor: Kathirgamar Aingaran, Sunnyvale, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/579,106

(22) Filed: May 25, 2000

(51) Int. Cl.[7] .................. H03K 19/096; H03K 19/20
(52) U.S. Cl. .................................. 326/95; 326/113
(58) Field of Search .......................... 326/95, 98, 112, 326/113, 119, 121

(56) References Cited

U.S. PATENT DOCUMENTS

| | | | |
|---|---|---|---|
| 4,767,947 A | * 8/1988 | Shah | 327/176 |
| 5,399,921 A | * 3/1995 | Dobbelaere | 326/113 |
| 5,736,868 A | 4/1998 | Kim et al. | 326/55 |
| 5,861,762 A | 1/1999 | Sutherland | 326/55 |

* cited by examiner

Primary Examiner—Michael Tokar
Assistant Examiner—James H. Cho
(74) Attorney, Agent, or Firm—Rosenthal & Osha L.L.P.

(57) ABSTRACT

A logic gate for producing an output signal representing a logical operation of a first logic signal and a second logic signal includes a first input terminal for receiving the first logic signal and a second input terminal for receiving the second logic signal. The logic gate further includes a first transistor, a second transistor, and an evaluation node which is connected to a pre-charge device. The first transistor has a first terminal coupled to the first input, a second terminal coupled to the evaluation node, and a third terminal coupled to the second input. The second transistor has a first terminal coupled to the second input, a second terminal coupled to the evaluation node, and a third terminal coupled to the first input. A change in either of the logic signals triggers the logic gate, and a change in both of the logic signals within a predetermined time period results in the logic signals simultaneously canceling each other out.

22 Claims, 4 Drawing Sheets

NON-MONOTONIC DYNAMIC EXCLUSIVE-OR/NOR GATE CIRCUIT

BACKGROUND OF THE INVENTION

1. Technical Field

The invention relates generally to logic gates used in integrated circuits. More specifically, the invention relates to the structure of a logic gate which implements an exclusive-OR/NOR function.

2. Background Art

A majority of modem large-scale integrated circuits, such as microprocessors and memories, comprise logic gates that use p-channel and n-channel field-effect transistors (FET) in a complementary fashion to perform different logic functions. To reduce the area occupied by the logic gates on a single chip, it is usually desirable to construct the logic gates from the barest minimum number of transistors possible. FIG. 1 illustrates a logic gate 2 which is based on complementary metal-oxide semiconductor (MOS) technology, or simply CMOS technology. The CMOS logic gate 2 includes a pre-charge device 4, an evaluation device 6, and a logic network 8. The pre-charge device 4 is a p-channel MOS (PMOS) transistor, and the evaluation device 6 is an n-channel MOS (NMOS) transistor. The gate terminals of the PMOS transistor 4 and the NMOS transistor 6 are connected to a clock signal (CLK). The drain terminal of the PMOS transistor 4 is connected to a node 7 of the logic network 8, and the source terminal of the NMOS transistor 6 is connected to a node 9 of the logic network 8. The source terminal of the PMOS transistor 4 is connected to a supply voltage signal ($V_{DD}$), and the drain terminal of the NMOS transistor 6 is connected to ground signal (GND).

The logic network 8 is designed such that the correct function is produced at the output (OUT) of the inverter 10. Without the presence of the inverter 10, the CMOS logic gate 2 would implement an exclusive-NOR (XNOR) function. The logic network 8 is made of NMOS transistors 12–18. The source terminals of the NMOS transistors 12, 14 are connected to the drain terminal of the PMOS transistor 4, and the drain terminals of the NMOS transistors 12, 14 are connected to the source terminals of the NMOS transistors 16, 18, respectively The drain terminals of the NMOS transistors 16, 18 are connected to the source terminal of the NMOS transistor 6. The gate terminals of the NMOS transistors 12, 18 receive input signals A and B, respectively. The gate terminals of the NMOS transistors 16, 14 receive input signals $\overline{A}$ and $\overline{B}$, respectively, where input signal $\overline{A}$ is the complement of input signal A, and input signal $\overline{B}$ is the complement of input signal B. The logic gate 2 requires additional circuitry (not shown) for producing the complement input signals $\overline{A}$ and $\overline{B}$. This additional circuitry increases the size and complexity of the logic gate 2.

SUMMARY OF THE INVENTION

One aspect of the invention is a logic gate for producing an output signal representing a logical operation of a first logic signal and a second logic signal. The logic gate comprises a first input which receives the first logic signal and a second input which receives the second logic signal. The logic gate further includes a first transistor, a second transistor, and an evaluation node which is connected to a pre-charge device. The first transistor has a first terminal coupled to the first input, a second terminal coupled to the evaluation node, and a third terminal coupled to the second input. The second transistor has a first terminal coupled to the second input, a second terminal coupled to the evaluation node, and a third terminal coupled to the first input. A change in either of the logic signals triggers the logic gate, and a change in both of the logic signals within a predetermined time period results in the logic signals simultaneously canceling each other out.

DETAILED DESCRIPTION OF THE INVENTION

Figure 2:
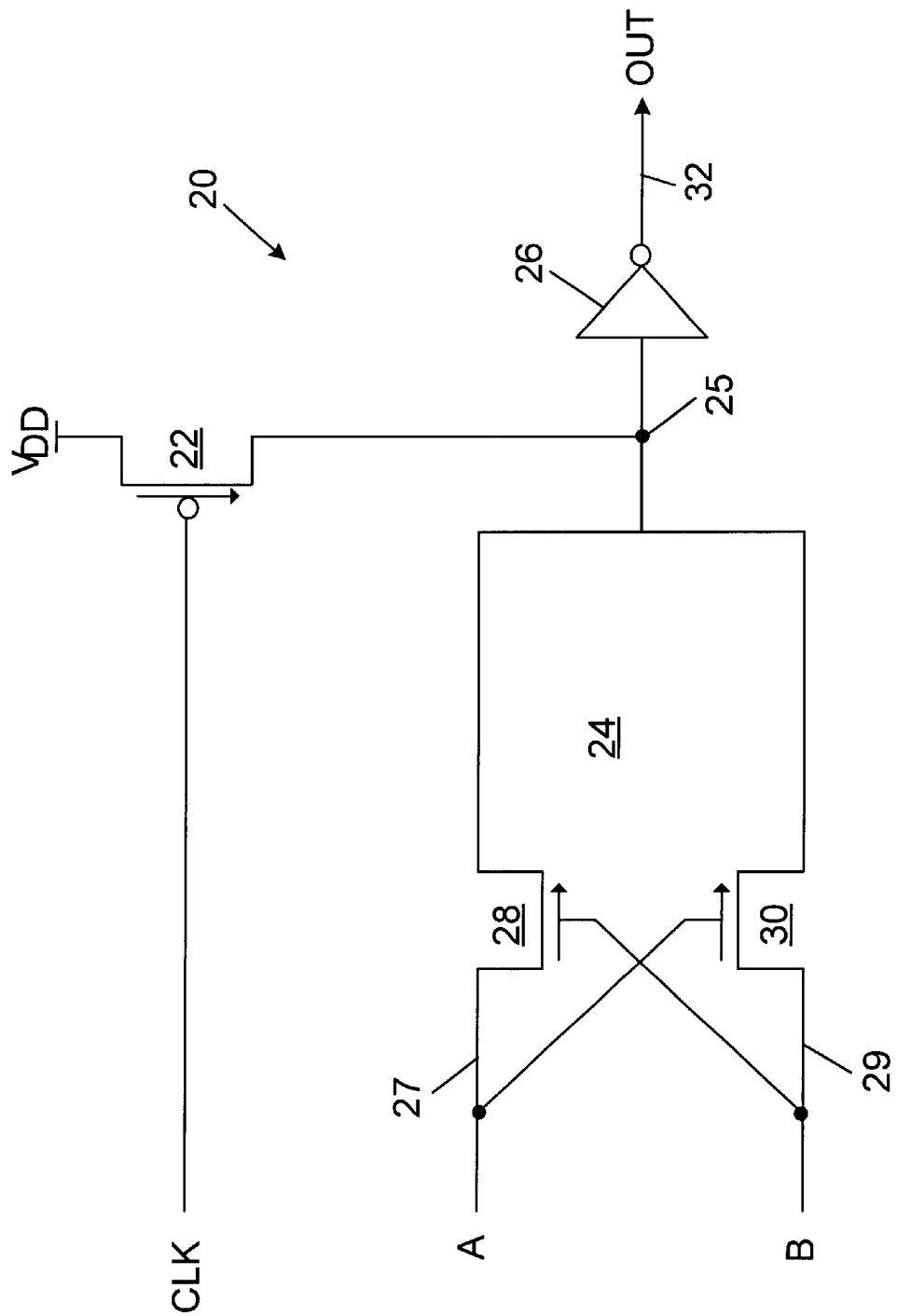
FIG. 2 is a circuit diagram of an XOR gate according to one embodiment of the invention.

Various exemplary embodiments of the invention will now be discussed in detail with reference to the accompanying figures. FIG. 2 shows a circuit diagram of a logic gate 20 which includes a pre-charge device 22, a logic network 24, and an inverter 26. The logic gate 20 implements an XOR function. Without the inverter 26, the logic gate 20 implements an XNOR function, with the output produced at the evaluation node 25 of the logic network 24. Alternatively, as those skilled in the art will appreciate, an XNOR function could be implemented by adding another inverter at the output of the inverter 26. The pre-charge device 22 is connected to a clock signal (CLK). During the pre-charge phase of the logic gate 20, the clock signal is low, so the evaluation node 25 is connected to a voltage supply signal ($V_{DD}$) through the pre-charge device 22 and is, therefore, pre-charged to the value of the voltage supply signal ($V_{DD}$). The evaluate phase of the logic gate 20 occurs when the clock signal goes high. At this time, the pre-charge device 22 is turned off, thus removing the pre-charge at evaluation node 25. When this occurs, the output of the inverter 26 then depends on the logic state of the logic network 24.

The logic network 24 includes a first transistor 28, a second transistor 30, and inputs 27 and 29. The transistors 28, 30 are n-channel field-effect transistors, e.g., NMOS transistors. Input 27 is connected to receive input signal A, and input 29 is connected to receive input signal B. The source terminal and the drain terminal of the first transistor 28 are coupled to input 27 and the evaluation node 25, respectively. The source terminal and the drain terminal of the second transistor 30 are coupled to input 29 and the evaluation node 25, respectively. The gate terminal of the first transistor 28 is connected to input 29, and the gate terminal of the second transistor 30 is connected to input 27. In the example embodiment shown, the pre-charge device 22 is a p-channel field-effect transistor, e.g., a PMOS transistor.

The drain terminal and the source terminal of the transistor 22 are coupled to the evaluation node 25 and the supply voltage signal ($V_{DD}$), respectively. The gate terminal of the p-channel transistor 22 is connected to the clock signal (CLK).

The XOR function is achieved by cross-coupling inputs 27, 29 and the gate terminals of the transistors 28, 30. During the evaluate phase of the logic gate 20, a change in either of the input signals A and B triggers the XOR gate 20, while a change in both input signals A and B results in the two input signals A and B simultaneously canceling each other out. The output signal (OUT) of the logic gate 20 is produced at the output 32 of the inverter 26. It should be noted that the logic gate 20 is stable only if the input signals A and B both change within a given time period, usually within one gate delay of each other. The XOR function may be incorrectly implemented in some applications if the input signals A and B are too far apart.

Figure 3:
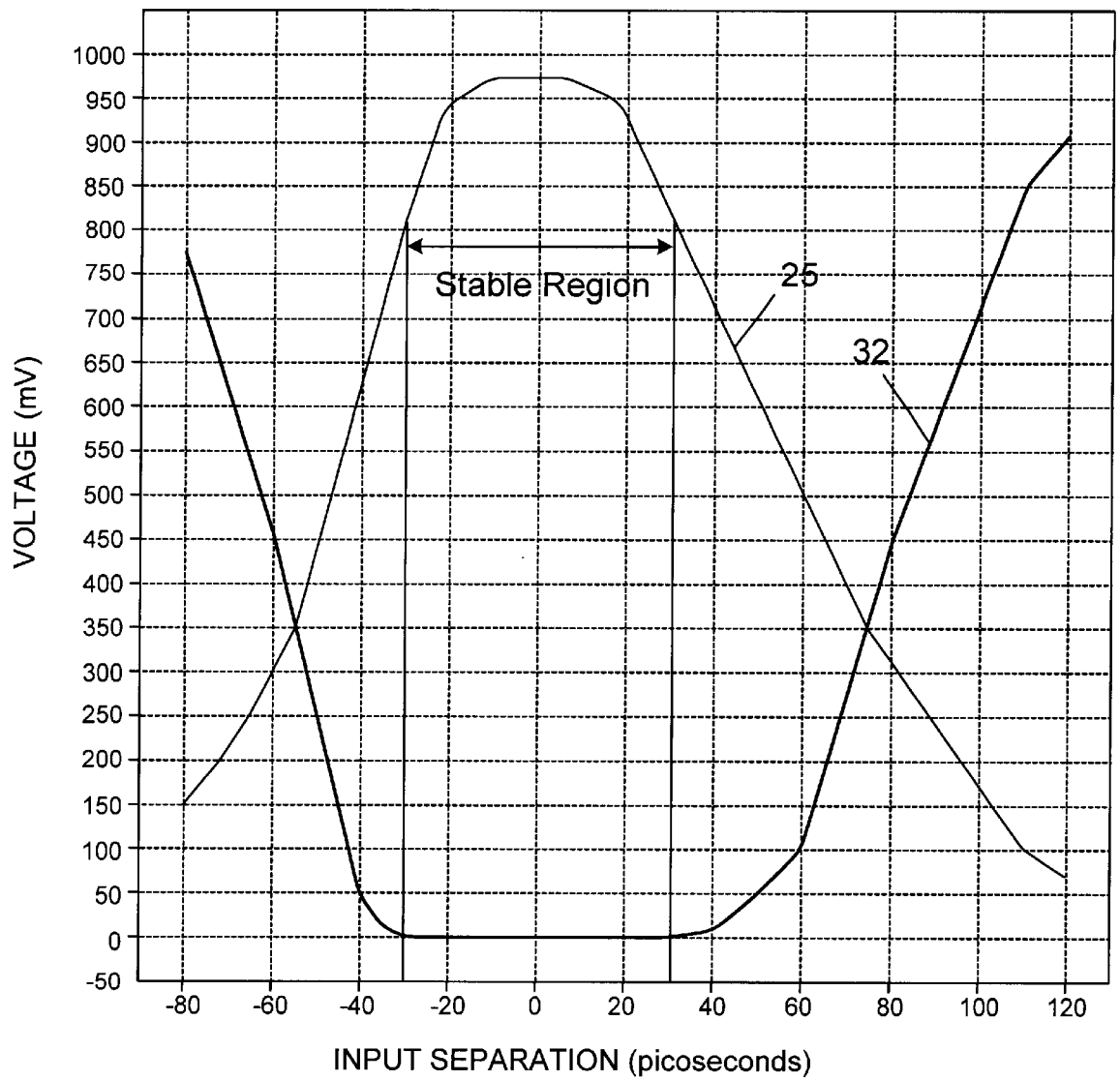
FIG. 3 is a graph of internal node voltage versus input separation in accordance with an embodiment of the invention.

FIG. 3 shows a plot of the voltage at the evaluation node 25 versus separation between the input signals A and B. This plot is specific to an example embodiment where the gate length of the MOS transistors used in the logic gate 20 is 0.15 µm. It should be understood, however, that the gate length of the MOS transistors will generally be selected to suit the specific application in which the logic gate 20 is used. FIG. 3 also shows a plot of the voltage at the output 32 of the inverter 26 as a function of input separation. In the example shown in FIG. 3, the logic gate 20 is stable when the input signals A and B both change within 30 picoseconds, which corresponds to one gate delay for the selected MOS transistors. In general, the duration of a gate delay will depend on the gate length of the MOS transistors used. In this example, the threshold voltage below which the XOR function is considered a failure is 20% of the maximum expected voltage, i.e., 200 mV. Of course, those skilled in the art will appreciate that different voltage criteria may be used to determine when the implementation of the XOR function is considered a failure.

Figure 1:
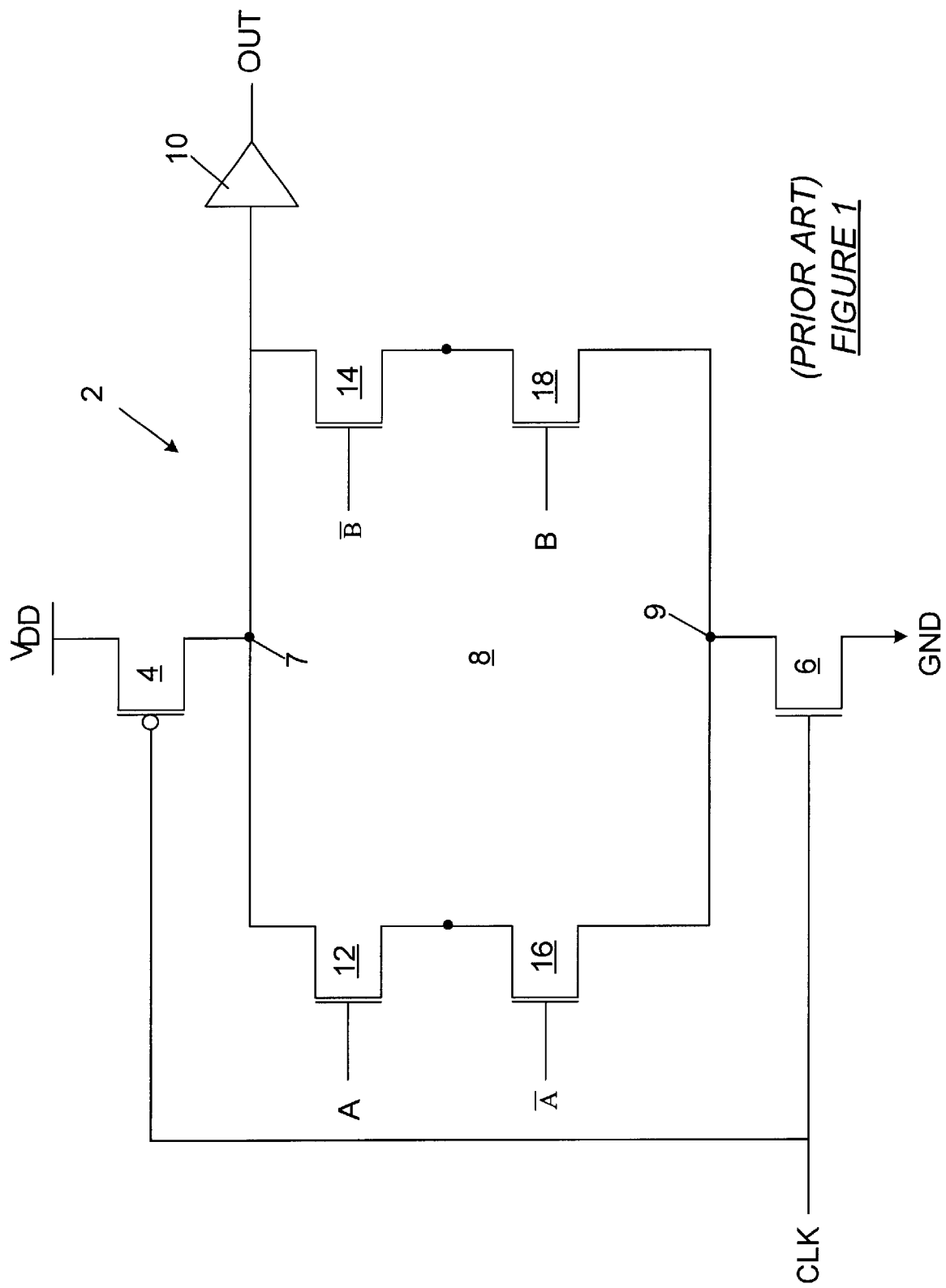
FIG. 1 is a circuit diagram of a prior art CMOS logic gate.

The logic gate 20 is most useful in places where the timing is tightly controlled, such as in clock blocked dynamic stages or immediately following flip-flops. But beyond that, the invention provides several advantages. One advantage is that the logic gate 20 uses only true inputs, i.e., input signals A and B, to implement the XOR function. In other words, the logic gate 20 does not require complements of the input signals A and B to implement the XOR function. A logic gate that can perform an XOR (or XNOR) function without complement inputs is said to be non-monotonic. Because the logic gate 20 does not require complement inputs, there is no need to provide additional circuitry for producing the complement inputs. This, of course, reduces the complexity of the integrated circuit in which the logic gate 20 is used. Another advantage of the invention is that the number of transistors required to implement the XOR function is substantially reduced, at least in comparison to the logic gate described in FIG. 1.

Figure 4:
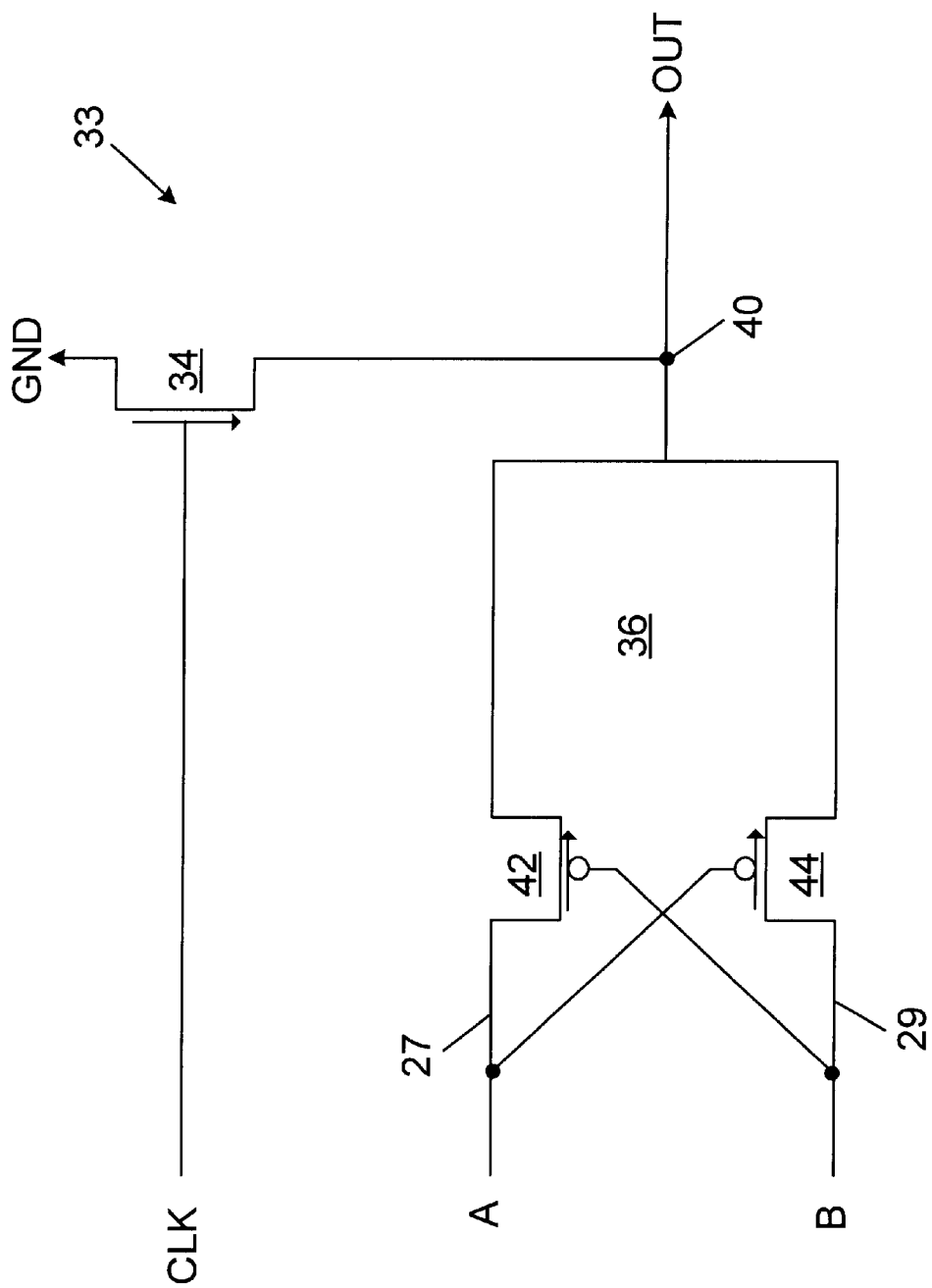
FIG. 4 is a circuit diagram of an XOR gate according to another embodiment of the invention.

The logic gate 20 has been described as a pre-charge gate in that it uses a pre-charge device 22 to pre-charge the evaluation node 25. However, the logic gate may also be implemented as a pre-discharge gate. As shown in FIG. 4, a logic gate 33 includes a pre-discharge device 34 and a logic network 36. The pre-discharge device 34 is an n-channel field-effect transistor, e.g., an NMOS transistor. The source terminal of the NMOS transistor 34 is connected to ground signal (GND), and the drain terminal of the NMOS transistor 34 is connected to the evaluation node 40 of the logic network 36. The gate terminal of the NMOS transistor 34 is coupled to clock signal (CLK). The logic network 36 is similar to the logic network 24, except that the it now includes p-channel field-effect transistors 42, 44 instead of NMOS transistors. An inverter is not needed at the evaluation node 40 to implement an XOR function. On the other hand, an inverter (not shown) is needed at the evaluation node 40 to implement an XNOR function.

It should be understood that the invention is not necessarily limited to p-channel and n-channel field-effect transistors, but other types of transistors may be used to construct the logic gate. In general, the transistors should be coupled in such a way that a change in either of the input signals A and B triggers the logic gate and a change in both the input signals A and B, within a given time period, results in the input signals simultaneously canceling each other out.

While the invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of the invention.

What is claimed is:

1. A logic gate for producing an output signal representing a logical operation of a first logic signal and a second logic signal, the logic gate comprising:

a first input receiving the first logic signal;

a second input receiving the second logic signal;

an evaluation node connected to a pre-charge device;

a fist transistor having a first terminal coupled to the first input, a second terminal coupled to the evaluation node, and a third terminal coupled to the second input; and a second transistor having a first terminal coupled to the second input, a second terminal coupled to the evaluation node, and a third terminal coupled to the first input;

wherein a change in either of the logic signals triggers the logic gate and a change in both of the logic signals within a predetermined time period results in the logic signals simultaneously canceling each other out; and wherein the pre-charge device has one end connected to a clock signal and another end connected to a supply voltage signal.

2. The logic gate of claim 1, further comprising an inverter having an input connected to the evaluation node.

3. The logic gate of claim 2, wherein the pre-charge device is a p-channel field-effect transistor.

4. The logic gate of claim 3, wherein the first and second transistors are n-channel field-effect transistors.

5. A logic gate for producing an output signal representing a logical operation of a first logic signal and a second logic signal, the logic gate comprising:

a first input receiving the first logic signal;

a second input receiving the second logic signal;

an evaluation node connected to a pre-discharge device;

a first transistor having a first terminal coupled to the first input, a second terminal coupled to an evaluation node, and a third terminal coupled to the second input; and a second transistor having a first terminal coupled to the second input, a second terminal coupled to the evaluation node, and a third terminal coupled to the first input;

wherein a change in either of the logic signals triggers the logic gate and a change in both of the logic signals within a predetermined time period results in the logic signals simultaneously canceling each other out; and wherein the pre-discharge device has one end connected to a clock signal and another end connected to ground.

6. The logic gate of claim 5, wherein the pre-discharge device is an n-channel field-effect transistor.

7. The logic gate of claim 6, wherein the first and second transistors are p-channel field-effect transistors.

8. A logic gate which implements an exclusive-OR function, comprising:

a pre-charge device having one end connected to a clock signal and another end connected to an evaluation node;

a first input which receives a first logic signal;

a second input which receives a second logic signal;

a first transistor having a first terminal coupled to the first input, a second terminal coupled to an evaluation node, and a third terminal coupled to the second input;

a second transistor having a first terminal coupled to the second input, a second terminal coupled to the evaluation node, and a third terminal coupled to the first input; and an inverter having an input connected to the evaluation node wherein a change in either of the logic signals triggers the logic gate and a change in both of the logic signals within a predetermined time period results in the logic signals simultaneously canceling each other out.

9. The logic gate of claim 8, wherein the first and second transistors are n-channel field-effect transistors.

10. The logic gate of claim 9, wherein the pre-charge device is a p-channel field-effect transistor.

11. A logic gate which implements an exclusive-NOR function, comprising:

a pre-charge device having one end connected to a clock signal and another end connected to an evaluation node;

a first input which receives a first logic signal;

a second input which receives a second logic signal;

a first transistor having a first terminal coupled to the first input, a second terminal coupled to an evaluation node, and a third terminal coupled to the second input; and a second transistor having a first terminal coupled to the second input, a second terminal coupled to the evaluation node, and a third terminal coupled to the first input;

wherein a change in either of the logic signals triggers the logic gate and a change in both of the logic signals within a predetermined time period results in the logic signals simultaneously canceling each other out.

12. The logic gate of claim 11, wherein the first and second transistors are n-channel field-effect transistors.

13. The logic gate of claim 12, wherein the pre-charge device is a p-channel field effect transistor.

14. A logic gate for producing an output signal representing a logical operation of a first logic signal and a second logic signal, the logic gate comprising:

a first input receiving the first logic signal;

a second input receiving the second logic signal;

a p-channel field-effect transistor having a first terminal coupled to an evaluation node, a second terminal connected to a voltage supply signal, and a gate connected to a clock signal;

a first n-channel field-effect transistor having a first terminal coupled to the first input, a second terminal coupled to the evaluation node, and a gate coupled to the second input; and a second n-channel field-effect transistor having a first terminal coupled to the second input, a second terminal coupled to the evaluation node, and a gate coupled to the first input wherein a change in either of the logic signals triggers the logic gate and a change in both of the logic signals within a predetermined time period results in the logic signals simultaneously canceling each other out.

15. The logic gate of claim 14, further comprising means for inverting the output of the evaluation node.

16. A logic gate for producing an output signal representing a logical operation of a first logic signal and a second logic signal, the logic gate comprising:

a first input receiving the first logic signal;

a second input receiving the second logic signal;

an n-channel field-effect transistor having a first terminal coupled to an evaluation node, a second terminal connected to a voltage supply signal, and a gate connected to a clock signal; p1 a first p-channel field-effect transistor having a first terminal coupled to the first input, a second terminal coupled to the evaluation node, and a gate coupled to the second input; and a second p-channel field-effect transistor having a first terminal coupled to the second input, a second terminal coupled to the evaluation node, and a gate coupled to the first input;

wherein a change in either of the logic signals triggers the logic gate and a change in both of the logic signals within a predetermined time period results in the logic signals simultaneously canceling each other out.

17. A method for operating a logic gate having a first input terminal receiving a first logic signal, a second input terminal receiving a second logic signal, an evaluation node connected to a pre-charge device, a first transistor having a first terminal coupled to the first input, a second terminal coupled to an evaluation node, and a third terminal coupled to the second input, and a second transistor having a first terminal coupled to the second input, a second terminal coupled to the evaluation node, and a third terminal coupled to the first input, the method comprising:

driving the evaluation node to a first state when the first logic signal and the second logic signal are both at the same state; and driving the evaluation node to a state that is inverse of the first state when the first logical signal is at a different state from the second logic signal;

wherein the pre-charge device has one end connected to a clock signal and another end connected to a supply voltage signal.

18. The method of claim 17, wherein the state of the evaluation node is unchanged when the state of the first logic signal and the state of the second logic signal both change within a predetermined time period.

19. The method of claim 17, further comprising inverting an output of the evaluation node.

20. A method for implementing an exclusive-OR function in dynamic CMOS logic using only true input signals, the method comprising:

receiving a first true input signal at a first terminal of a first MOS transistor and at a third terminal of a second MOS transistor, wherein the first and second MOS transistors have a first conductivity channel;

receiving a second true input signal at a first terminal of the second MOS transistor and at a third terminal of the first MOS transistor;

receiving a clock signal at a first terminal of a third MOS transistor having a second conductivity channel;

driving an evaluation node coupled to second terminals of the MOS transistors to a first state when the first and second true input signals are both at the same state; and driving the evaluation node to a state that is inverse of the first state when the first true input signal is at a different state from the second true input signal;

wherein the state of the evaluation node is unchanged when the state of the first true input signal and the state of the second true input signal both change within a predetermined time period.

21. The method of claim 20, wherein the first conductivity channel is an n-channel and the second conductivity channel is a p-channel, and further comprising inverting an output of the evaluation node.

22. The method of claim 20, wherein the first conductivity channel is a p-channel and the second conductivity channel is an n-channel.

* * * * *